United States Patent [19]

Waldo, III

[11] Patent Number: 4,891,094
[45] Date of Patent: Jan. 2, 1990

[54] METHOD OF OPTIMIZING PHOTORESIST CONTRAST

[75] Inventor: Whitson G. Waldo, III, Chandler, Ariz.

[73] Assignee: Motorola, Inc., Schaumburg, Ill.

[21] Appl. No.: 356,488

[22] Filed: May 25, 1989

[51] Int. Cl.$^4$ .................. B44C 1/22; B29C 37/00; H01L 21/306

[52] U.S. Cl. ................... 156/626; 156/659.1; 427/10; 427/43.1; 430/313

[58] Field of Search ............ 156/626, 627, 655, 659.1, 156/661.1, 904; 427/8, 9, 10, 43.1; 356/381, 382, 445, 448; 430/296, 313

[56] References Cited

U.S. PATENT DOCUMENTS 4,462,860 7/1984 Szmanda .......................... 156/626
4,575,399 3/1986 Tanaka et al. ................. 156/626 X Primary Examiner—William A. Powell
Attorney, Agent, or Firm—Charles R. Lewis

[57] ABSTRACT

The contrast of a photoresist layer used in a lithographic process for a given light source is optimized by determining the nonlinear relationship of the photoresist contrast with regard to the thickness thereof and then placing over a substrate a thickness of photoresist corresponding to a desired value of contrast indicated by the nonlinear relationship of contrast with photoresist thickness. The nonlinear contrast with regard to photoresist thickness function is a damped, sinusoidal like function with the difference between maxima and minima contrast values decreasing as the photoresist thickness increases and with higher absolute maxima values for contrast as photoresist thickness decreases. The amount of light needed to fully expose a given thickness of photoresist also varies with the photoresist thickness in a sinusoidal like manner and a phase difference may exist between the sinusoidal like contrast versus photoresist thickness function and the sinusoidal like exposing light versus photoresist thickness function. It is possible that the light source and the photoresist characteristics can be selected to product a predetermined phase difference.

14 Claims, 2 Drawing Sheets

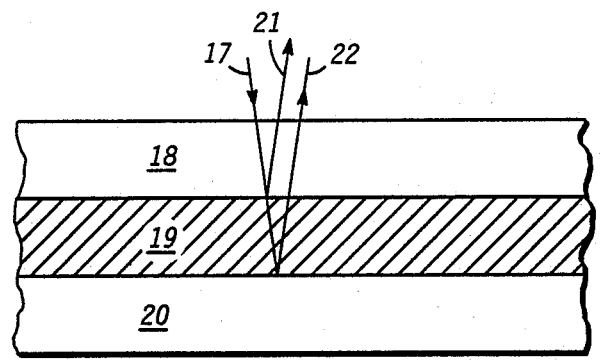
FIG. 3
FIG. 4
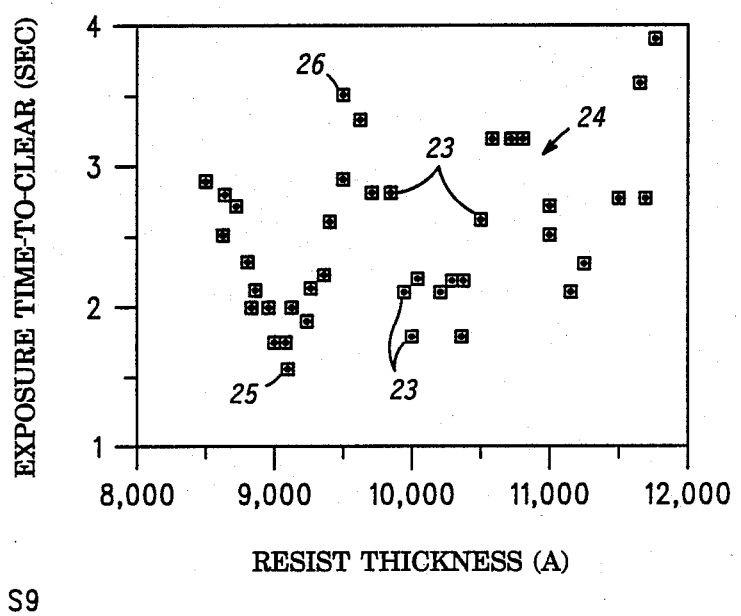
□ = S9

METHOD OF OPTIMIZING PHOTORESIST CONTRAST

FIELD OF THE INVENTION

This invention relates to photoresist used to manufacture integrated circuits by a lithographic process and more particularly to optimizing the contrast of the photoresist by controlling the thickness of the photoresist.

BACKGROUND OF THE INVENTION

The manufacture of integrated circuits involves placing controlled amounts of impurities into tiny regions located on a semiconductor substrate that are subsequently interconnected. This is generally accomplished by a lithographic process that includes applying a thin film of photoresist onto a substrate, usually silicon or silicon dioxide, and exposing the photoresist to radiation such as ultraviolet light, x-rays, an electron beam, an ion beam or the like. An obstacle to the radiation, such as a mask or recticle, is placed between the source of radiation and the photoresist layer to selectively expose the photoresist layer with a desired pattern. The areas exposed to radiation are either soluble or insoluble in a solvent known as a developer. If the exposed photoresist is soluble a positive image is produced and the photoresist is termed a positive resist whereas if the exposed photoresist is insoluble in the developer it produces a negative image in the photoresist layer and the photoresist is termed a negative resist.

Subsequent to development, the areas of the substrate not covered by the photoresist are subject to further processing steps while the areas of the substrate still covered by the photoresist are protected from these process steps by the photoresist. This process is repeated until the desired integrated circuit is completed in a manner well known in the art.

As integrated circuits become more complex it is desirable that increasing numbers of active and passive electrical elements be included on a single chip. This is best accomplished by decreasing the physical size of the active and passive elements rather than by increasing the physical size of the chip. Smaller geometries however are limited by the resolution capabilities of the lithographic process and include hardware limitations such as the mechanical stability of the system, the optical characteristics of the lens, light source, etc. Optical and process characteristics of the photoresist also affect the best resolution that can be obtained with any lithographical system.

Heretofore in the prior art, the contrast of the photoresist layer has been enhanced to improve the resolution of the lithographic system. This is accomplished in a well known manner by the use of multilayer photoresists (MLR) of different properties as well as by covering the photoresist with a contrast enhancement layer (CEM). Both of these techniques are not only costly but add complexity to the overall process and result in lower yields due to increased defectivity caused by the more complex processing.

An object of this invention is to improve the resolution of a lithographic process that uses a photoresist by optimizing the contrast of the photoresist.

Another object of this invention is to optimize the contrast of a photoresist without adding to the complexity of the lithographic process.

A further object of this invention is to optimize the contrast of photoresist by controlling the thickness of a layer of photoresist.

SUMMARY OF THE INVENTION

According to this invention the contrast of a photoresist layer used in a lithographic process is optimized by determining the nonlinear relationship of said photoresist contrast with regard to the thickness thereof and then placing over a substrate a thickness of photoresist corresponding to a desired value of contrast indicated by the nonlinear relationship of contrast with photoresist thickness.

The nonlinear contrast with regard to photoresist thickness function is a damped, sinusoidal like curve such that the difference between maxima and minima contrast values decreased as the photoresist thickness increases and with higher maxima values for contrast as photoresist thickness decreases. Although the effect is greater for maxima, minima values for contrast also rise as photoresist thickness decreases.

The amount of light needed to fully expose a given thickness of photoresist also varies with the photoresist thickness in a sinusoidal like manner and a phase difference may exist between the sinusoidal like contrast versus photoresist thickness function and the sinusoidal like exposing light versus photoresist thickness function. It is possible that the light source and the photoresist can be selected to produce a predetermined phase difference.

BRIEF DESCRIPTION OF THE DRAWING

This invention will be apparent from the following detailed description taken in conjunction with the drawings herein and wherein:

FIG. 3 illustrates radiation reflected back through the photoresist in a lithographic process, and FIG. 4 illustrates the exposure radiation to clear $E_O$ versus photoresist thickness function.

DETAILED DESCRIPTION OF THE INVENTION

Figure 1:
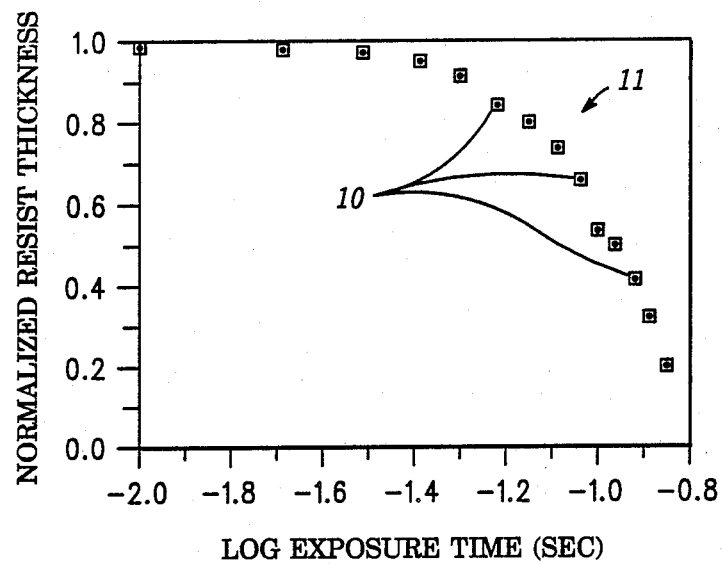
FIG. 1 illustrates a photoresist characteristic curve.

Both the contrast and sensitivity of photoresist can be measured in a well known manner by exposing a given thickness of a photoresist layer to varying doses of radiation and then measuring the thickness of photoresist remaining for each radiation dose after development. This information is plotted to obtain a photoresist characteristic curve. Such a characteristic curve 11 is shown in FIG. 1 wherein each point 10 thereon corresponds to a given radiation dose and the thickness of photoresist remaining after development. The intercept of the curve 11 with the X axis gives the minimum radiation dose needed to completely clear the given thickness of photoresist after the development step. By repeating this process for the same photoresist and radiation source but using different thickness layers of photoresist, the sensitivity and contrast characteristics of the particular photoresist can be determined.

In accordance with the present invention, the slope of the invention of the curve 11 as it intercepts the X or radiation dose axis is determined to find the contrast of the given layer thickness of photoresist and is plotted against the photoresist thickness that is cleared by the intercept radiation dose after development. Each point 12 of the curve 14 in FIG. 1 therefore corresponds to the slope of the intercept of curve 11 of FIG. 1 with the X axis for different thickness layers of photoresist.

Figure 2:
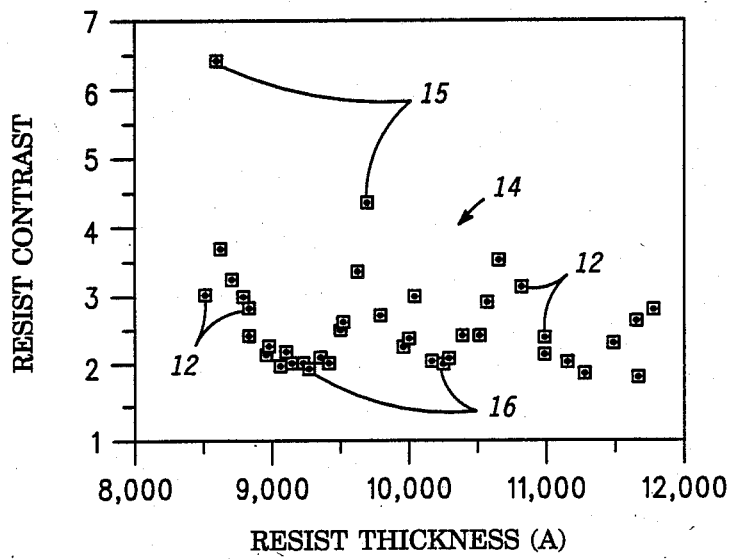
FIG. 2 illustrates the nonlinear contrast versus photoresist thickness function in accordance with the present invention.

A perusal of FIG. 2 shows that the contrast $\gamma$ value of a given photoresist versus thickness photoresist function or curve 14 is nonlinear, damped and sinusoidal like, i.e. similar to a damped sinewave. As shown by FIG. 2, the maximum absolute value of contrast increases as the photoresist thickness decreases as doe the difference between the maxima 14 and minima 12 values of contrast. Further, the semiconductor industry at this time typically operates with photoresist thicknesses of about 12,000 Angstroms or greater which photoresist thickness exhibits the smallest difference between maxima 15 and minima 16 values of contrast, as shown by FIG. 2.

The sinusoidal like curve 14 of FIG. 2 is believed to be due to radiation standing waves caused by interference between the exposing radiation and reflections thereof. For example, the photoresist layer typically covers a substrate such as polysilicon or gallium arsenide or the photoresist may cover a substrate such as silicon dioxide which overlays the polysilicon or gallium arsenide. The exposing radiation passes through the photoresist down to the silicon dioxide and/or polysilicon and is at least partially reflected therefrom to constructively and destructively interfere with the exposing radiation to form standing waves within the photoresist layer. This is schematically illustrated in FIG. 3 wherein exposing radiation 17 passes through a photoresist layer 18 and is partially reflected 21 by an oxide layer 19 and also partially reflected 22 by a substrate 20.

In accordance with the present invention the contrast versus photoresist thickness function curve 14 of FIG. 2 is used to optimize the contrast of photoresist used to manufacture integrated circuits with a lithographic process. For example, if contrast is the only criteria, the contrast characteristic such as that shown in FIG. 2 can be used to select the photoresist thickness that provides the maxima absolute contrast. Sometimes, the photoresist thickness is dictated by other factors other than just contrast. Assume for example that for a variety of reasons a photoresist thickness of about 9000 Angstroms is to be used. Reference to curve 14 of FIG. 2 shows that if this thickness is increased slightly to about 9600 Angstroms or decreased slightly to about 8600 Angstroms that much high values of contrast $\gamma$ for the photoresist can be obtained and therefore improved resolution with all of its associated advantages re size and density of the resulting integrated circuits.

As will be apparent from the above, the contrast $\gamma$ versus photoresist thickness function or curve 14 shown in FIG. 2 can be determined for any resist and radiation source and thereafter used to optimize the contrast of the photoresist in a lithographic process to manufacture product such as semiconductor devices, printed circuit boards and the like.

Once the value of photoresist thickness is determined, the amount of radiation $E_O$ needed to clear the thickness of photoresist selected by development must be determined. This is accomplished in a well known manner. For example, the intercept of curve 11 of FIG. 1 with the or radiation dose axis gives the amount of radiation needed to clear the thickness of photoresist after development for which curve 11 is a characteristic curve. By taking this intercept value Eo for the same radiation source and photoresist but for different photoresist thicknesses, the radiation to clear dose $E_O$ versus photoresist thickness function or curve can be plotted. Such a curve 24 is shown in FIG. 4. Like curve 14 in FIG. 2, the curve 24 is similar to a sinewave. This is believed to also be due to a standing wave set up within the photoresist by the exposing radiation that passes through the photoresist that is then partially reflected back from a substrate(s) (FIG. 3) to constructively and destructively interact with the exposing radiation.

For a given thickness of photoresist, the curve 24 of FIG. 4 gives the radiation exposure dose $E_O$ needed to just clear the given thickness of photoresist when the photoresist is developed. Since the thickness of the layer of photoresist may not be exactly uniform, the actual value of radiation exposure $E_O$ selected may be slightly greater than that given by FIG. 4 to insure that photoresist areas thicker than the given or selected photoresist are also cleared by the development step.

A perusal of FIGS. 2 and 4 show that the maxima and minima of curves 14 and 24 are not exactly in phase for given thicknesses of photoresist. It is possible, however, that by selecting the characteristics of the photoresist and/or the source of radiation that a desired or predetermined phase relationship may be obtained between the contrast $\gamma$ and radiation exposure $E_O$ characteristic curves 14 and 24, respectively, to further optimize the lithographic process.

The photoresist characteristic curve of FIG. 1 was generated by making open frame (i.e., exposures with no pattern) exposures of increasing exposing dose into a photoresist film coated on a bare silicon wafer. In these data an exposure of one second gives 300 mJ/cm$^2$. The open frame resist thicknesses after development were analyzed using a Nanospec Film Thickness Analyser. The photoresist was Aspect Systems 9 photoresist processed at 100° C. prebake and 120° C. post exposure bake (PEB).

The contrast $\gamma$ of the S9 photoresist shown in FIG. 2 was calculated from the slope of the least squares fitted line for normalized film thicknesses between 15–80%. These criteria are somewhat arbitrary, but at thicknesses greater than 80% the shoulder effects adversely effect the calculations, since the shoulder is not part of the linear response. Also, at film thicknesses less than 15% data are noisy. The contrast $\gamma$ values were calculated for each photoresist coated wafer (i.e., each run) using at least five data points for the linear least squares fit. The value for the exposure time-to-clear, $E_O$ (i.e., the intersection at the X-axis by the curve 11) was obtained by extrapolating the linear fit of the characteristic curve 11 for normalized photoresist thickness to 0.0.

Curve 24 of FIG. 4, as described above, shows the dependence of exposure radiation to clear $E_O$ upon standing wave interference effects. This curve 24 also illustrates climbing exposure to clear $E_O$ values at $E_O$ minima as the photoresist thickens. This is attributed to an average exposure radiation intensity decrease with increasing photoresist thickness caused by optical absorption of the photoresist, resulting in an attenuation of the radiation intensity for thicker photoresist films.

Similar to exposure radiation to clear $E_O$, photoresist contrast $\gamma$ as shown by curve 14 of FIG. 2 also varies with photoresist thickness, again the result of standing wave interference as described hereinabove. Experimentation with other i-line resists indicated that this is a generic phenomenon as the data show a trend of rising contrast $\gamma$ maxima values 15 as the photoresist thickness is decreased. In fact, at photoresist thicknesses above about 1.2 microns, the effect of contrast γ dependence on standing wave interference becomes relatively small. As photoresist thickness decreases, the value of contrast γ at photoresist thicknesses of maximum destructive wave interference increases. Even the values of contrast γ at photoresist thicknesses of maximum constructive wave interference show slight improvement with thinner photoresist films.

The use of the method described herein to obtain optimum contrast for photoresist also resulted in improved lithographic process latitude. Tests showed that the process latitude for the two most important lithographic manufacturing factors, i.e. exposure and defocus was about 100% greater by using the method described herein rather than using a thickness of photoresist determined by the maximum radiation exposure to clear as heretofore practiced in the prior art.

As will now be apparent, the subject invention provides improved resolution to enable the manufacture of more dense semiconductor product with improved line control without the use of costly and defect producing contrast enhancement materials by optimizing the contrast of a photoresist by determining the contrast versus thickness characteristic of the photoresist and therefrom selecting an optimum photoresistor thickness.

While this specification illustrates and describes a specific embodiment of this invention, it is not to be interpreted as limiting the scope of this invention as set forth in the appended claims inasmuch as other embodiments of this invention will become evident to those of ordinary skill in the art in light of the teaching contained herein.

What is claimed is:

1. Optimizing the contrast of a photoresist layer used in the manufacture of integrated circuits by a lithographic process including:
    determining the nonlinear relationship of said photoresist contrast with regard to the thickness thereof, and
    placing over a substrate a thickness of photoresist corresponding to a desired value of contrast indicated by said nonlinear relationship of contrast with photoresist thickness.

2. Optimizing the contrast of a photoresist layer used in the manufacture of integrated circuits by
    exposing a portion of a layer of photoresist over a substrate to a source of light with at least a portion of said light reflected by said substrate back through said photoresist, and
    selecting a thickness for said photoresist layer prior to said step of exposing that causes a substantial maxima of destructive standing wave interference between said exposing light and said reflected portion thereof.

3. The method according to claim 2 wherein said light source is substantially monochromatic.

4. Optimizing the contrast of a photoresist layer used in the manufacture of integrated circuits by
    determining the nonlinear relationship of the photoresist contrast to the thickness thereof for a given light source,
    laying a thickness of photoresist corresponding to a desired value of contrast shown by said nonlinear relationship of contrast and photoresist thickness over a substrate, and
    exposing at least a portion of the surface of said photoresist layer to said light source.

5. The method of claim 4 wherein said light source is approximately monochromatic.

6. The method according to claim 4 wherein a portion of said exposing light is reflected by said substrate back through said photoresist.

7. The method according to claim 6 wherein said reflected light and said exposing light result in standing wave interference within said photoresist.

8. The method according to claim 4 wherein said portion of said photoresist layer exposed to said light source receives a predetermined amount of light energy.

9. The method according to claim 4 wherein said nonlinear contrast with regard to photoresist thickness function is a sinusoidal like function.

10. The method according to claim 9 where said sinusoidal like contrast versus photoresist thickness function is damped such that the difference between maxima and minima contrast values decrease as the photoresist thickness increases.

11. The method according to claim 9 wherein said sinusoidal like contrast versus photoresist thickness function includes higher maxima values for contrast as photoresist thickness decreases.

12. The method according to claim 9 where the amount of light needed to fully expose a given thickness of photoresist varies with the photoresist thickness in a sinusoidal like manner.

13. The method according to claim 12 wherein said light source characteristics and said photoresist characteristics cause a phase difference to exist between said sinusoidal like contrast versus photoresist thickness function and said sinusoidal like exposing light versus photoresist thickness function.

14. The method according to claim 13 wherein said light source and said photoresist produce a predetermined said phase difference.

* * * * *

UNITED STATES PATENT AND TRADEMARK OFFICE
CERTIFICATE OF CORRECTION

PATENT NO. : 4,891,094

DATED : January 2, 1990

INVENTOR(S) : Whitson G. Waldo, III

It is certified that error appears in the above-identified patent and that said Letters Patent is hereby corrected as shown below:

Front page, ABSTRACT [57], line 21, delete "product" and insert --produce--.

Column 3, line 2, delete "FIG. 1" and insert --FIG. 2--.

Column 3, line 10, delete "doe" and insert --does--.

Column 3, line 11, delete "14" and insert --15--.

Column 3, line 11, delete "12" and insert --16--.

Column 3, line 65, after "the" (first occurrence) insert --X--.

Signed and Sealed this

Fifth Day of March, 1991

Attest:

HARRY F. MANBECK, JR.

*Attesting Officer*   *Commissioner of Patents and Trademarks*